United States Patent
Murayama et al.

(10) Patent No.: US 8,281,226 B2
(45) Date of Patent: Oct. 2, 2012

(54) REPRODUCTION APPARATUS AND REPRODUCTION METHOD

(75) Inventors: Toshiyuki Murayama, Kanagawa (JP); Hiroshi Iino, Tokyo (JP)

(73) Assignee: Sony Corporation, Tokyo (JP)

(*) Notice: Subject to any disclaimer, the term of this patent is extended or adjusted under 35 U.S.C. 154(b) by 505 days.

(21) Appl. No.: 12/621,563

(22) Filed: Nov. 19, 2009

(65) Prior Publication Data
US 2010/0125775 A1    May 20, 2010

(30) Foreign Application Priority Data
Nov. 20, 2008   (JP) ................. P2008-296734

(51) Int. Cl.
*G11C 29/00* (2006.01)
(52) U.S. Cl. ........... 714/769; 714/6.24; 714/752
(58) Field of Classification Search ........ 714/6.24, 714/752, 769
See application file for complete search history.

(56) References Cited

U.S. PATENT DOCUMENTS

| | | | |
|---|---|---|---|
| 6,519,715 B1 * | 2/2003 | Takashi et al. | 714/32 |
| 7,055,082 B2 * | 5/2006 | Mori et al. | 714/768 |
| 7,322,003 B2 * | 1/2008 | Ishii | 714/769 |
| 8,169,825 B1 * | 5/2012 | Shalvi et al. | 365/185.09 |
| 2007/0273999 A1 * | 11/2007 | Utsumi et al. | 360/75 |
| 2008/0178060 A1 * | 7/2008 | Takashi et al. | 714/763 |

FOREIGN PATENT DOCUMENTS

| | | |
|---|---|---|
| JP | 7 65312 | 3/1995 |
| JP | 11 65778 | 3/1999 |
| JP | 11 66763 | 3/1999 |
| JP | 2001 14811 | 1/2001 |
| JP | 2006 120256 | 5/2006 |

* cited by examiner

*Primary Examiner* — Charles Ehne
(74) *Attorney, Agent, or Firm* — Frommer Lawrence & Haug LLP; William S. Frommer (57) ABSTRACT

A reproduction apparatus includes a reproduction unit reading a reproduced signal of the data recorded on an optical disk, a reproduced signal processing unit performing ECC decoding for the reproduced signal using a predetermined parameter value, a storage unit storing the parameter number associated with the currently set parameter value and a parameter table listing parameter values and associated parameter numbers, and a control unit controlling the reproduction unit and the reproduced signal processing unit. The control unit, when ECC decoding fails, changes the parameter values in the order of the parameter numbers and controls the reproduced signal processing unit until ECC decoding succeeds in retried reproduction processing and, when ECC decoding succeeds, stores the parameter number associated with the currently set parameter value and sets in the next retried reproduction processing the parameter value associated with the stored parameter number in the reproduced signal processing unit.

5 Claims, 8 Drawing Sheets

| PARAMETER NUMBER | PARAMETER VALUE |
|---|---|
| #1 | PARAMETER VALUE EFFECTIVE FOR SCRATCHES |
| #2 | PARAMETER VALUE EFFECTIVE FOR DUST |
| #3 | PARAMETER VALUE EFFECTIVE FOR BUBBLES |
| #4 | PARAMETER VALUE EFFECTIVE FOR FINGERPRINT STAINS |

| PARAMETER NUMBER | PARAMETER VALUE |
|---|---|
| #1 | 0x0d |
| #2 | 0x0d |
| #3 | 0x0d |
| #4 | 0x09 |
| #5 | 0x09 |

REPRODUCTION APPARATUS AND REPRODUCTION METHOD

BACKGROUND OF THE INVENTION

1. Field of the Invention

The present invention relates to a reproduction apparatus and method for reproducing data recorded on an optical disk, and in particular to a reproduction apparatus and method for efficiently reading data from defective locations on an optical disk.

2. Description of the Related Art

A reproduction apparatus that reproduces data recorded on an optical disk reads the data in units of RUB (Read Unit Block) which is the minimum recording unit on the optical disk.

In this type of reproduction apparatuses, the data read out of a specific RUB on the optical disk may be lost due to failure in decoding the error correction code (ECC) for that data. ECC decoding may fail due to defects on the disk surface, such as scratches, dust, fingerprint stains, and minute bubbles produced when the optical disk was molded.

In reproduction apparatuses in the related art, to prevent the data loss due to such defects, parameters are set for reproduction processing and ECC decoding is attempted by applying the parameters to the data read out of the disk. Usually, these parameters can be changed depending on the types of defects to improve the data readout performance.

For example, Japanese Unexamined Patent Application Publication No. 2006-286112 describes a reproduction technique for setting an optimal parameter by determining the presence/absence of a defect and determining the kind of the defect on the basis of the minuteness and size of the defect.

In addition to the reproduction technique described in Japanese Unexamined Patent Application Publication No. 2006-286112, another reproduction technique is in practical use in which a plurality of parameters used for various types of defects are prepared in advance and ECC decoding is attempted by sequentially changing the parameters. In this reproduction technique, the parameters prepared in advance are arranged in a specific order in advance and ECC decoding are retried by changing the parameters in this order until ECC decoding is successfully completed.

The data reproduction technique in such a reproduction apparatus in the related art will now be described more specifically. In this type of reproduction apparatus, data is read sequentially from the RUBS arranged, for example, in an annual ring-like structure on the recording medium. In the first reproduction processing (referred to below as "normal reproduction processing" where appropriate) for the data read out of a specific RUB, a parameter is set to its initial value and ECC decoding is attempted for this data. If the ECC decoding is not successfully completed in the normal reproduction processing, the reproduction apparatus changes the parameter setting and retries the reproduction processing (referred to below as "retried reproduction processing" where appropriate).

Parameter values used in the retried reproduction processing are listed in a parameter table. For example, a plurality of parameter values are listed in the order of application for ECC decoding. More specifically, for example, a parameter value effective for scratches on the disk is listed first in the parameter table and a parameter value effective for dust is listed second. A parameter value effective for bubbles on the disk is listed third and a parameter value effective for fingerprint stains is listed fourth.

If ECC decoding fails in the normal reproduction processing, the reproduction apparatus sequentially changes the parameter values by looking up the parameter table and repeats the retried reproduction processing until ECC decoding is successfully completed. Once ECC decoding is completed, data is read out of the next RUB and ECC decoding for this data is attempted in the normal reproduction processing. Since a defect often occurs in an extremely limited area on the disk, the parameter is reset to its initial value after ECC decoding is completed for a specific RUB.

As described above, in a related-art reproduction apparatus installed in a personal computer (PC) for example, if ECC decoding is not successfully completed in the normal reproduction processing, retried reproduction processing is repeated the allowed number of times to complete ECC decoding.

Suppose that a defect is present in a specific RUB and ECC decoding for the data read out of this RUB was successfully completed with the fourth parameter value in the parameter table, that is, ECC decoding was not successfully completed in the normal reproduction processing and was successfully completed in the fourth retried reproduction processing.

After ECC decoding for the data read out of a specific RUB is completed using the fourth parameter value, the reproduction apparatus resets the parameter to its initial value and reads data out of the next RUB and attempts ECC decoding for this data. In this manner, ECC decoding is attempted independently for the data read out of each RUB.

Suppose that, after an optical head of the reproduction apparatus has read data on the disk with a rotation, ECC decoding is attempted for the data read out of the RUB radially adjacent to the RUB where the retried reproduction processing was previously performed. If the current RUB is also defective and reproduction processing is retried, the type of defect in the current RUB is probably the same as the one in the RUB where the retried reproduction processing was previously performed, because a defect often extends over a plurality of radially adjacent RUBs. In this case, ECC decoding for the current RUB would probably be successfully completed if the fourth parameter value were used.

SUMMARY OF THE INVENTION

In the reproduction apparatuses in the related art, the parameter is reset to its initial value after ECC decoding is completed for the data read out of a defective RUB, as described above. When ECC decoding is attempted for the data read out of the next defective RUB, the parameter values are sequentially changed beginning with its initial value, even if the type of defect is the same as the previous one.

That is, in this example, even if the type of defect is predictable, the normal reproduction processing is first performed and then the retried reproduction processing is repeated four times until ECC decoding is completed. It takes a long time to complete ECC decoding with the different parameter values, which may cause the reproduction bit rate to be lowered accordingly. In broadcasting stations or other systems that use real-time operation, increase in the time spent for reproduction would pose a significant problem.

In the reproduction apparatuses in the related art, if a defect is present, ECC decoding is attempted repeatedly by changing the parameter values beginning with its initial value as described above. This increases the number of repetitions of the retried reproduction processing and thus the time to complete ECC decoding.

In addition, increase in the time spent for ECC decoding due to an increase in the number of times of retried reproduction processing leads to the increase in power consumption for ECC decoding. The increased power consumption poses a significant problem particularly on battery-driven mobile electronic devices such as notebook PCs, for example.

It is accordingly desirable to provide a reproduction apparatus and method for efficiently completing ECC decoding for the data recorded in defective locations on a recording medium and thus reducing the time spent for ECC decoding.

According to an embodiment of the present invention, there is provided a reproduction apparatus including a reproduction unit reading a reproduced signal of the data recorded on an optical disk in unit of recorded data; a reproduced signal processing unit performing ECC decoding for the reproduced signal using a predetermined parameter value set for the ECC decoding; a storage unit storing the parameter number associated with the currently set parameter value and a parameter table listing a plurality of parameter values and associated parameter numbers indicating the order of application of the parameter values; and a control unit controlling the reproduction unit and the reproduced signal processing unit. The control unit, when ECC decoding is not successfully completed, sequentially changes the parameter values in the order of the parameter numbers listed in the parameter table and controls the reproduced signal processing unit until the ECC decoding is successfully completed in the retried reproduction processing and, if the ECC decoding is successfully completed, stores in the storage unit the parameter number associated with the currently set parameter value and sets in the next retried reproduction processing the parameter value associated with the stored parameter number in the reproduced signal processing unit.

According to another embodiment of the present invention, there is provided a reproduction method including the step of performing reproduction by reading a reproduced signal of the data recorded on an optical disk in units of recorded data, the step of processing the reproduced signal by performing ECC decoding using a predetermined parameter value set for the ECC decoding for the reproduced signal read out of the optical disk, the step of storing in a storage unit a parameter number associated with the currently set parameter value and a parameter table listing a plurality of parameter values and associated parameter numbers indicating the order of application of the parameter values, and the step of controlling the step of performing reproduction and the step of processing the reproduced signal. The step of controlling, when the ECC decoding is not successfully completed, changes parameter setting in the order of the parameter numbers listed in the parameter table and controls the step of processing the reproduced signal until the ECC decoding is successfully completed in the retried reproduction processing and, when ECC decoding is successfully completed, stores in the storage unit the parameter number associated with the currently set parameter value and sets in the next retried reproduction processing the parameter value associated with the stored parameter number.

As described above, according to the embodiments of the present invention, the reproduced signal is read out of an optical disk in units of recorded data, a parameter is set to a value predetermined for the ECC decoding for the reproduced signal read out of the optical disk, ECC decoding is attempted for the reproduced signal, the parameter number associated with the currently set parameter value and a parameter table listing a plurality of parameter values and associated parameter numbers indicating the order of application of the parameter values are stored in a storage unit and, if ECC decoding is not successfully completed, parameter setting is changed in the order of the parameter numbers listed in the parameter table and the step of processing the reproduced signal is controlled to attempt ECC decoding in the retried reproduction processing until the ECC decoding is successfully completed and, if ECC decoding is successfully completed, the parameter number associated with the currently set parameter value is stored in the storage unit and the parameter value associated with the stored parameter number is set in the next retried reproduction processing so that ECC decoding is efficiently completed in the retried reproduction processing.

According to the embodiments of the present invention, the parameter number associated with the parameter value that was set in the retried reproduction processing in which ECC decoding was successfully completed is stored for the ECC decoding in the next retried reproduction processing. In the next retried reproduction processing, ECC decoding is attempted by sequentially changing the parameter values beginning with the parameter value associated with the stored parameter number. Because the parameter value that is supposed to be most effective for the current defect is first set in the retried reproduction processing, ECC decoding is efficiently completed in a short time in the retried reproduction processing.

DESCRIPTION OF THE PREFERRED EMBODIMENTS

Embodiments of the present invention will now be described in this order:
1. Embodiment
2. Modification of Embodiment 1. Embodiment An embodiment of the present invention will be described with reference to the drawings. According to the embodiment, when a defect is present on the surface of a recording medium such as an optical disk, reproduction processing is retried by sequentially changing parameters until ECC decoding is successfully completed. The parameter that was set in the retried reproduction processing in which the ECC decoding was completed is stored. When data is read out of the next defective location, ECC decoding is attempted by sequentially changing the parameters beginning with the stored parameter.

[Configuration of Reproduction Apparatus]

Figure 1:
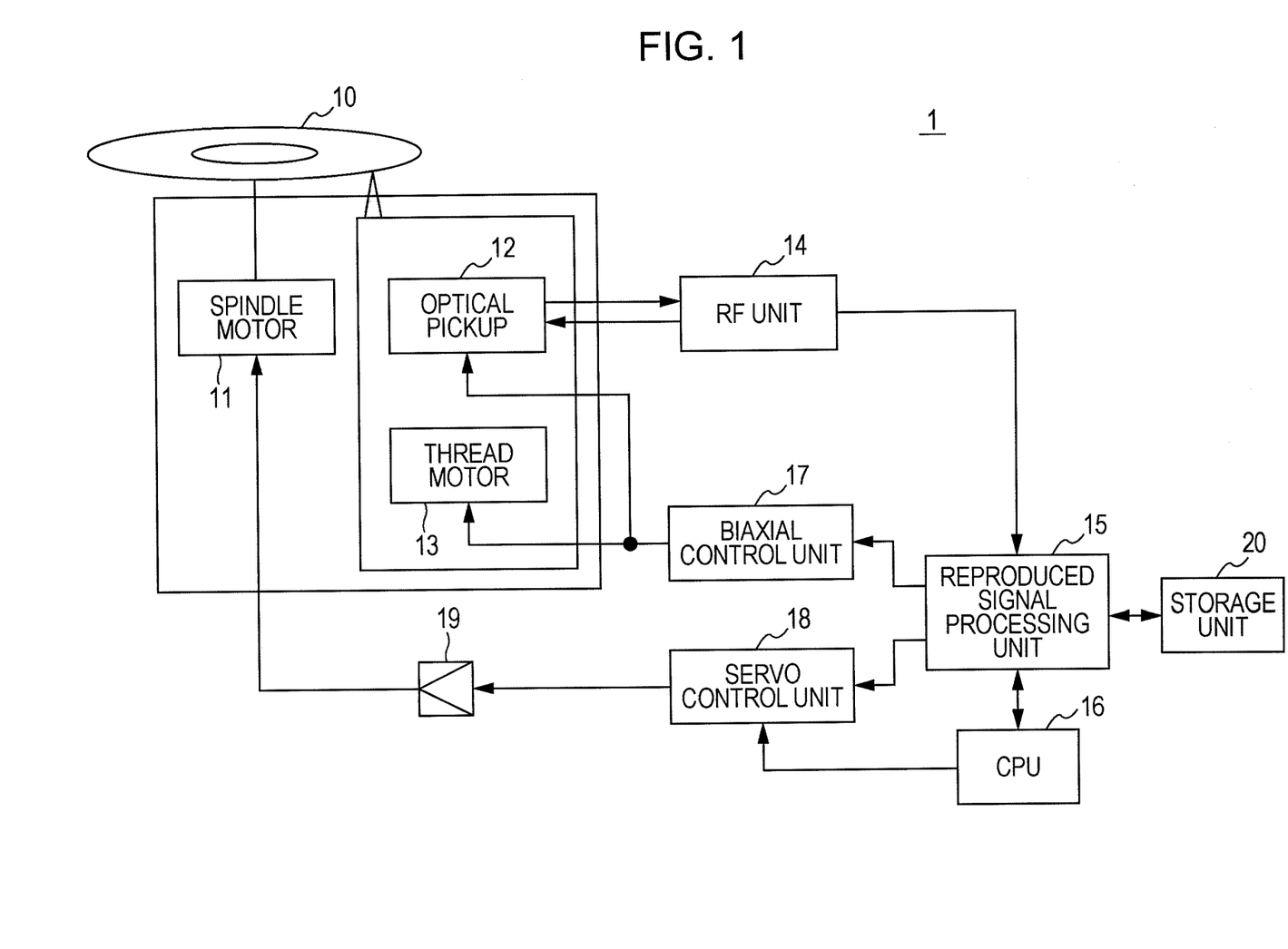
FIG. 1 is a block diagram showing the configuration of an exemplary reproduction apparatus applicable to an embodiment of the present invention.

FIG. 1 shows the configuration of an exemplary reproduction apparatus 1 applicable to an embodiment of the present invention. In the example shown in FIG. 1, only those elements closely related to the embodiment of the present invention are described and other elements are omitted from the drawings and description. The reproduction apparatus 1 includes a spindle motor 11, optical pickup 12, thread motor 13, radio frequency (RF) unit 14, reproduced signal processing unit 15, central processing unit (CPU) 16, biaxial control unit 17, servo control unit 18, amplifier 19, and storage unit 20.

A drive shaft of the spindle motor 11 is integrated with a disk table for mounting an optical disk 10. The spindle motor 11 rotates an optical disk 10 mounted on the disk table by rotating the drive shaft in response to drive signals supplied from the servo control unit 18 described below. For example, the spindle motor 11 rotates the drive shaft at a constant linear velocity (CLV) or at a constant angular velocity (CAV). The servo control unit 18 generates the drive signals for driving the spindle motor 11 and supplies them through the amplifier 19 to the spindle motor 11.

The optical pickup 12 directs a laser beam onto the optical disk 10 and receives the laser light reflected from the optical disk 10. The optical pickup 12 includes, although not shown, a laser diode as a laser light source, a laser diode driver driving the laser diode, an optical system focusing the laser light emitted from the laser diode into a laser beam directed onto a recording layer of the optical disk 10, and a photodetector detecting the laser light reflected from the optical disk 10. The optical system is biaxially driven, in the disk surface direction and in the disk radius direction, to control focus and tracking in response to the drive signals supplied from the biaxial control unit 17.

The optical system divides one laser beam into one 0th-order light beam and two 1st-order light beams through a grating or the like and directs these light beams onto the optical disk 10. The photodetector includes two bisected detectors each having two bisected light reception surfaces and a quadrant detector having four quadrant light reception surfaces, for example. The photodetector receives each one of the two reflected 1st-order light beams on each of the bisected detectors and one reflected 0th-order light beam on the quadrant detector and outputs the signals detected on the light reception surfaces.

The RF unit 14 receives the signals that were detected on each of the light reception surfaces of the photodetector and output from the optical pickup 12. The RF unit 14 amplifies the received signals and generates a focus error signal and a tracking error signal by performing predetermined computation between the signals. The RF unit 14 also generates a reproduced RF signal according to the laser light reflected from the optical disk 10. The reproduced RF signal, focus error signal, and tracking error signal that were generated by the RF unit 14 are supplied to the reproduced signal processing unit 15.

Furthermore, the RF unit 14 generates a light quantity control signal on the basis of the signals supplied from the optical pickup 12 and supplies the light quantity control signal to the laser diode driver in the optical pickup 12 to control the light quantity of the laser beam directed onto the optical disk 10.

During reproduction, the reproduced signal processing unit 15 performs, under control of the CPU 16, predetermined signal processing on the reproduced RF signal supplied from the RF unit 14. After the predetermined signal processing, the reproduced signal processing unit 15 performs A/D conversion on the reproduced RF signal and decodes the error correction code and the recorded code of the reproduced data. After being decoded, the reproduced data is output to outside through an interface (not shown). The reproduced signal processing unit 15 performs the predetermined signal processing and A/D conversion of the supplied focus error signal and tracking error signal and supplies the digitized signals to the biaxial control unit 17.

Figure 2:
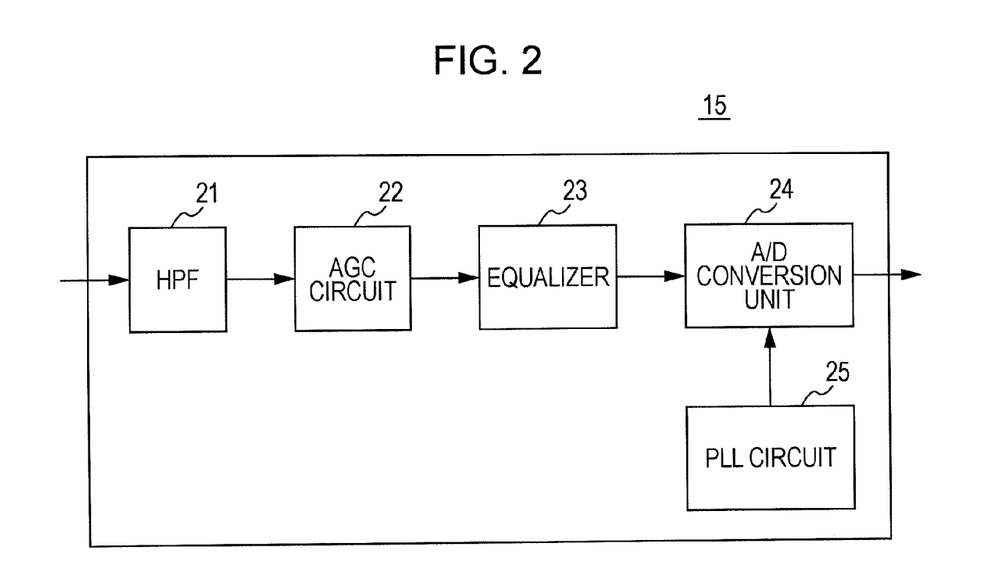
FIG. 2 is a block diagram showing the configuration of an exemplary reproduced signal processing unit.

FIG. 2 shows the configuration of an exemplary reproduced signal processing unit 15. In the example shown in FIG. 2, for clarity, only those elements related to the signal processing and A/D conversion of the reproduced RF signals supplied from the RF unit 14 are shown and the elements related to the processing after the A/D conversion are omitted. The reproduced signal processing unit 15 includes, on the side where the reproduced RF signal is input, a high-pass filter (HPF) 21, auto gain control (AGC) circuit 22, equalizer 23, analog/digital (A/D) conversion unit 24, and phase locked loop (PLL) circuit 25.

The high-pass filter 21 suppresses low-frequency components of the frequency band of the reproduced RF signal input into the reproduced signal processing unit 15. The low-frequency component to be suppressed is determined by a low-cutoff frequency. The low-cutoff frequency can be changed and set under control of the CPU 16 described below.

Figure 3:
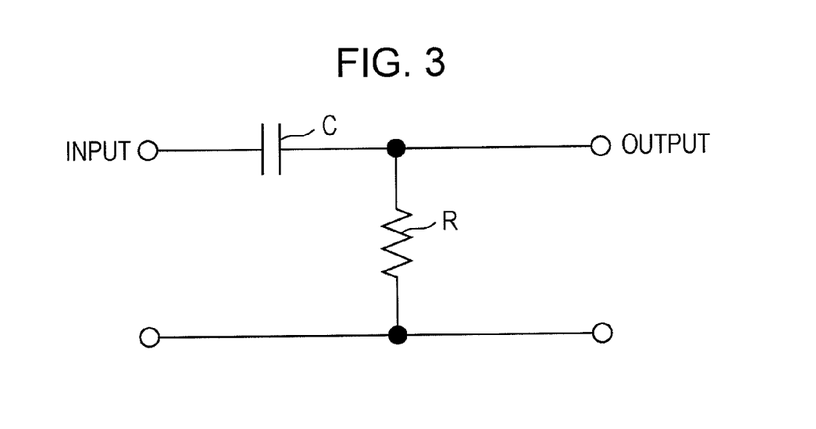
FIG. 3 is a schematic diagram showing the configuration of an exemplary bypass filter.

The high-pass filter 21 includes, for example as shown in FIG. 3, a capacitor C connected in series with a signal line and a resistor R connected in parallel with the signal line. The low-cutoff frequency in the high-pass filter 21 can be determined by the values of the capacitor C and resistor R and can be changed by changing the value of the resistor R for example. More specifically, a plurality of resistors R may be connected in parallel so as to be selected by a switch or the like, for example. The low-cutoff frequency can be changed with the switch that selects a specific resistor R out of the plurality of resistors R connected in parallel.

When the signal level of the reproduced RF signal output from the high-pass filter 21 varies with the optical disk 10 or the positions where the RF signal is read, the AGC circuit 22 automatically stabilizes the signal level at a certain level. The response speed, i.e., the rising speed, of the reproduced RF signal output from the AGC circuit 22 is determined by an AGC time constant. The AGC time constant can be changed and set under control of the CPU 16.

The equalizer 23 compensates for the attenuation of a high frequency level of the reproduced RF signal output from the AGC circuit 22. The A/D conversion unit 24 converts the analog signal output from the equalizer 23 to a digital signal. The PLL circuit 25 generates clock signals on the basis of synchronization signals recorded on the optical disk 10 and supplies them to the A/D conversion unit 24.

Referring again to FIG. 1, the CPU 16 controls the reproduction apparatus 1 as a whole according to a program stored in advance in a read only memory (ROM) (not shown). Based on parameter values listed in a parameter table stored in the storage unit 20, the CPU 16 controls the reproduced signal processing unit 15 to set the low-cutoff frequency for the high-pass filter 21 and the AGC time constant for the AGC circuit 22, as shown in FIG. 2. The parameter table will be described below in more detail.

Based on the supplied signals, the biaxial control unit 17 controls the operation of the biaxial mechanism of the optical pickup 12. The biaxial control unit 17 generates drive signals according to an instruction from the CPU 16 and supplies them to the thread motor 13 to move the optical pickup 12 to a specified track position on the optical disk 10. Based on the drive signals supplied from the biaxial control unit 17, the thread motor 13 moves the optical pickup 12 in the radial direction of the optical disk 10.

[Overview of Reproduction Method]

A method of reproduction by a reproduction apparatus applicable to the embodiment of the present invention will now be described in detail. To reproduce data recorded on a recording medium such as an optical disk, the reproduction apparatus reads the data in units of RUB (Read Unit Block), which is a minimum recording unit on the optical disk, and performs ECC decoding for this data by applying a predetermined parameter.

In the first reproduction processing (referred to below as "normal reproduction processing" where appropriate) for the data read out of a specific RUB, the parameter is set to its initial value and ECC decoding is attempted for this data. The ECC decoding in the normal reproduction processing may fail due to a defect on the surface of the optical disk, such as scratches, dust, and fingerprint stains. If the ECC decoding fails in the normal reproduction processing, the reproduction processing is retried (referred to below as "retried reproduction processing" where appropriate) in which parameter setting is changed and ECC decoding is attempted again.

The initial value of the parameter is a value that assures an optimum error rate when a defect-free location on the surface of the optical disk 10 is reproduced. For the retried reproduction processing due to an defect on the surface of the optical disk 10, parameter setting is changed. In the retried reproduction processing, the parameter is set to a value suitable for the current defect so that ECC decoding can be successfully completed.

Figure 4:
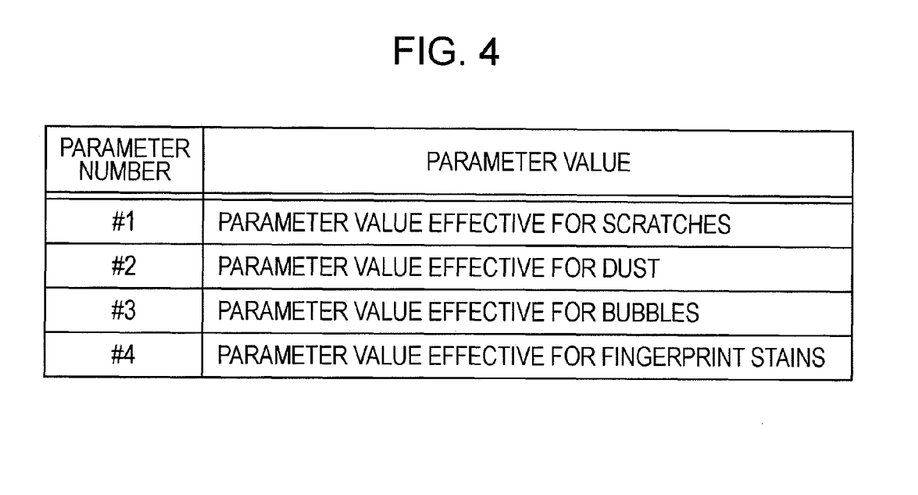
FIG. 4 is a schematic diagram showing an exemplary parameter table.

For the retried reproduction processing, several parameter values are prepared in advance and listed in the parameter table. As shown in FIG. 4, a plurality of parameter values and associated parameter numbers are listed in the parameter table. In this example, four parameter values are listed in the parameter table.

The parameter numbers indicate the order of the parameter values to be applied when the retried reproduction processing is repeatedly performed. These parameter values were proved effective for various defects in the experiment performed in advance, for example. More specifically, the parameter value associated with the parameter number #1 is effective for scratches and the parameter value associated with the parameter number #2 is effective for dust, for example. The parameter value associated with the parameter number #3 is effective for bubbles and the parameter value associated with the parameter number #4 is effective for fingerprint stains. Details of the parameter will be described below.

Figure 5:
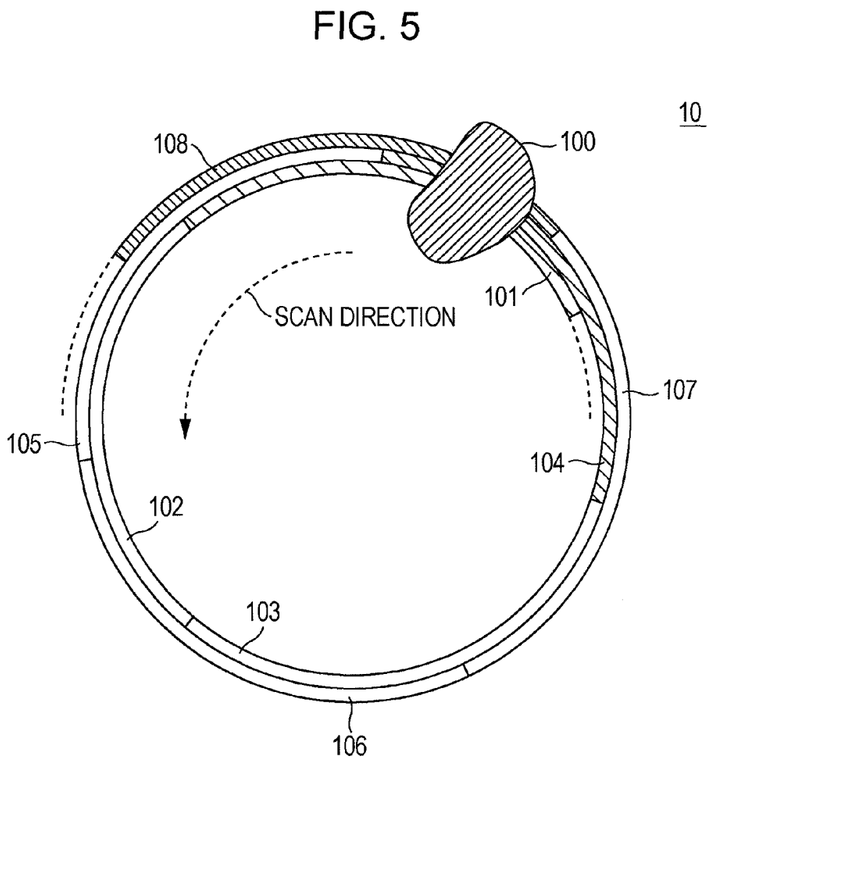
FIG. 5 is a schematic diagram illustrating a reproduction method applicable to the embodiment of the present invention.

Suppose that the optical disk 10 to be reproduced has a defect 100 on its surface, as shown in FIG. 5. On the optical disk 10, data is recorded in RUBs of a predetermined length that are sequentially disposed in an annual ring-like structure. To reproduce the data recorded on the optical disk 10, reproduction processing is performed by sequentially reading the data in units of RUB from a first RUB 101 at the inner periphery to an eighth RUB 108 at the outer periphery, as the optical head of the reproduction apparatus sequentially scans the optical disk 10 from the inner periphery toward the outer periphery. In this example, the defect 100 due to a fingerprint stain exists over the first RUB 101, fourth RUB 104, and eighth RUB 108.

First, the reproduction apparatus sets the parameter to its initial value and performs normal reproduction processing for the first RUB 101. The initial value of the parameter is a value that assures an optimum error rate when a location without the defect 100 is reproduced. In this example, ECC decoding is not successfully completed because of the defect 100 on the first RUB 101. The reproduction apparatus, therefore, changes the parameter value and performs the retried reproduction processing for the first RUB 101.

When the retried reproduction processing is repeated, ECC decoding is repeatedly attempted by applying the parameter values in the order of the parameter numbers listed in the parameter table as shown in FIG. 4.

In this example, in the first retried reproduction processing for the first RUB 101, the reproduction apparatus attempts ECC decoding for the first RUB 101 by applying the parameter value of parameter number #1. In this example, however, the defect 100 is caused by a fingerprint stain. ECC decoding is not successfully completed because the parameter value of parameter number #1 is effective for scratches and not suitable for the current defect 100.

Next, the reproduction apparatus attempts ECC decoding in the second retried reproduction processing by applying the parameter value of parameter number #2. ECC decoding fails again because the parameter value of parameter number #2 is effective for dust. Then, the reproduction apparatus attempts ECC decoding in the third retried reproduction processing by applying the parameter value of parameter number #3. ECC decoding fails again because the parameter value of the parameter number #3 is effective for bubbles.

Next, the reproduction apparatus attempts ECC decoding in the fourth retried reproduction processing by applying the parameter value of parameter number #4. This time, ECC decoding is successfully completed because the parameter value of parameter number #4 is effective for fingerprint stains and suitable for the current defect 100.

In this manner, in the retried reproduction processing performed for the first defective RUB on the optical disk 10 after reproduction processing has started for the optical disk 10, ECC decoding is first attempted with the parameter value of parameter number #1.

In the embodiment of the present invention, the parameter number associated with the parameter value that was applied in the previously retried reproduction processing in which ECC decoding was successfully completed is stored. In this example, the parameter number #4 is stored because ECC decoding was successfully completed with the parameter value associated with parameter number #4.

Once ECC decoding is completed for the first RUB 101, the reproduction apparatus resets the parameter to its initial value and performs normal reproduction processing for the next, or second, RUB 102. ECC decoding is successfully completed in the normal reproduction processing because there is no defect 100 on the second RUB 102. Once ECC decoding is completed for the second RUB 102, the reproduction apparatus performs normal reproduction processing for the third RUB 103. ECC decoding is successfully completed in the normal reproduction processing for the third RUB 103 because there is no defect 100 on the RUB 103.

Once ECC decoding is completed for the third RUB 103, the reproduction apparatus performs normal reproduction processing for the fourth RUB 104. ECC decoding fails for the data read out of the fourth RUB 104 because of the defect 100 on the fourth RUB 104. The reproduction apparatus, therefore, changes the parameter value and performs retried reproduction processing for the fourth RUB 104.

In the embodiment of the present invention, the parameter number associated with the parameter value applied in the previously retried reproduction processing in which ECC decoding was successfully completed is stored. The reproduction apparatus, accordingly, attempts ECC decoding in the first retried reproduction processing for the fourth RUB 104 by applying the parameter value associated with the stored parameter number.

In this example, ECC decoding is attempted by applying the parameter value associated with the stored parameter number #4. This ECC decoding is successfully completed because this parameter value is effective for fingerprint stains and suitable for the current defect 100. The reproduction apparatus stores the parameter number #4 associated with this parameter value.

Once ECC decoding is completed for the fourth RUB 104, the reproduction apparatus resets the parameter to its initial value and sequentially performs reproduction processing for the fifth RUB 105 through the eighth RUB 108, as described above. ECC decoding is successfully completed in the normal reproduction processing for the fifth RUB 105, sixth RUB 106, and seventh RUB 107, where no defect 100 is present.

In the eighth RUB 108, where the defect 100 is present, ECC decoding is not successfully completed in the normal reproduction processing. ECC decoding is attempted in the retried reproduction processing by applying the parameter value associated with the stored parameter number #4. This time, ECC decoding is successfully completed because this parameter value is effective for fingerprint stains and suitable for the current defect 100. Then, the reproduction apparatus stores the parameter number #4 associated with this parameter value.

In this manner, by applying the parameter value associated with the stored parameter number and performing ECC decoding, the number of repetitions of retried reproduction processing can be reduced and the time to successfully complete ECC decoding can be shortened accordingly.

[Parameter]

The parameters set for ECC decoding will now be described in detail. As described above, in the related art, ECC decoding has been attempted for the data read out of the optical disk 10 by applying predetermined parameters in the normal reproduction processing and retried reproduction processing.

In the past, these parameters were used to set, for example, an amplifier gain for reproduced RF signals, a cutoff frequency for filtering, boosted bandwidth, boosted level, offset feedback gain, offset mode, PLL loop gain for obtaining reproduced clocks, and reference amplitude value for Viterbi decoding.

In this case, however, the verification of the effects of parameter changes may be complicated because of a large number of items used in parameter setting.

In the embodiment of the present invention, therefore, only the low-cutoff frequency for the high-pass filter 21 and the AGC time constant for the AGC circuit 22, both shown in FIG. 2, are set by the parameter applied for ECC decoding.

The low-cutoff frequency is a suppressed low-frequency component of the frequency band of the reproduced RF signal input into the high-pass filter 21. The low-cutoff frequency is changed to change the suppressed low-frequency band, thereby suppressing transient variations of the reproduced RF signal envelopes when data is read out of a defective location.

In addition, noise produced in unnecessary frequency bands is removed and the signal-to-noise ratio (SNR) of the reproduced RF signal is improved.

The AGC time constant indicates the response speed, or the rising speed, of the reproduced RF signal input into the AGC circuit 22. The AGC time constant is changed to change the response speed of the reproduced RF signal of the read data for more precise transient response control.

In this manner, the low-cutoff frequency and AGC time constant can be set to the most effective values for various defects, so the operation of the PLL circuit 25 can be stabilized, the SNR of the reproduced RF signal can be improved, and the data read error rate can be improved. Further, the parameter in the embodiment of the present invention can simplify the control algorithm of the control software and achieve its effect in a very short time, compared with the complicated related-art parameter setting. The effects of parameter changes, accordingly, can be verified easily.

The parameter table will now be described in more detail. Although different parameter values are listed in the parameter table in the example shown in FIGS. 4 and 5, the embodiment of the present invention is not limited thereto. For example, when data is read out of a defective location, the reproduced RF signal processing system and the servo system may operate in an unstable manner due to random disturbances. In such a case, the data may not be reliably read if the parameter value effective for the current defect is applied only once in the retried reproduction processing.

In the embodiment of the present invention, a single parameter value is successively set for a plurality of parameter numbers in the parameter table and the retried reproduction processing is repeated several times with the same parameter value. This ensures that data can be reliably read out of the defective location.

It has been experimentally proved that data can be reliably read out of a defective location when the retried reproduction processing is repeated three times with the same parameter value.

Figure 6:
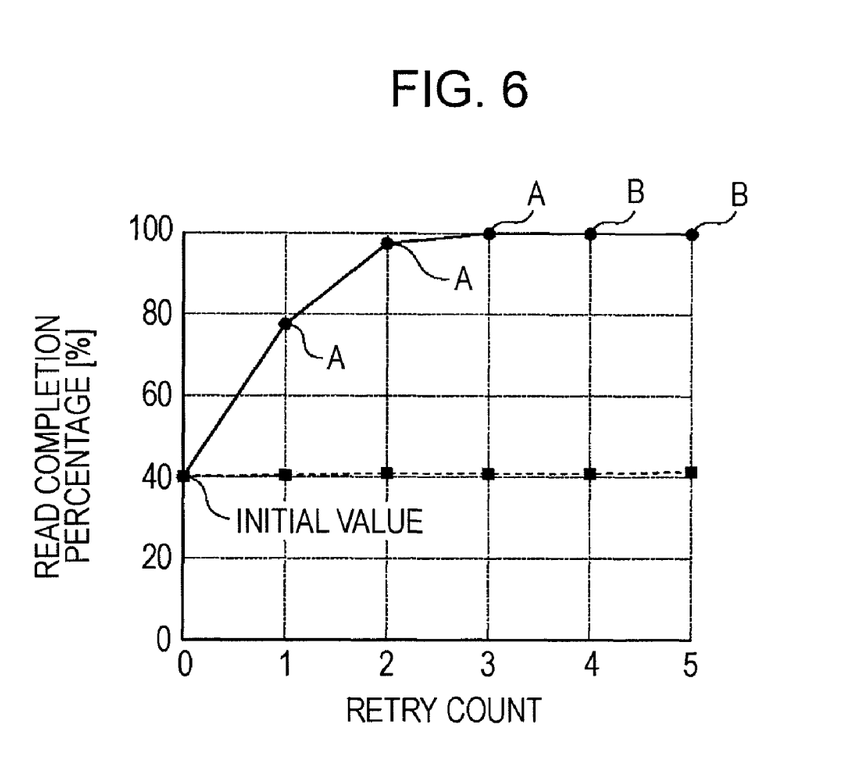
FIG. 6 is a schematic diagram illustrating the relationship between the number of retries and the readout completion percentages.

FIG. 6 shows an exemplary relationship between the number of retries and the read completion percentages achieved by repeatedly applying the same parameter value in the retried reproduction processing for the data read out of 100 RUBs. The horizontal axis indicates the number of repetitions of the retried reproduction processing. The vertical axis indicates the read completion percentages of the number of RUBS for which ECC decoding was successfully completed to the total number of RUBS from which data was read. This example shows the percentage of the number of RUBs for which ECC decoding was successfully completed to the 100 RUBs for which ECC decoding was attempted.

In the example shown in FIG. 6, ECC decoding was attempted for the data read out of 100 RUBs. In the first normal reproduction processing, the parameter was set to its initial value. In the first to third repetitions of retried reproduction processing, the parameter was set to "parameter value A", and in the fourth and fifth repetitions of retried reproduction processing, the parameter was set to another "parameter value B".

The read completion percentage was approximately 40% in the normal reproduction processing (retry count is zero) performed with the parameter set to its initial value. Next, the read completion percentage increased to approximately 75% in the first retried reproduction processing performed with the parameter set to the "parameter value A". Then, the read completion percentage increased to approximately 95% in the second retried reproduction processing performed with the parameter set to the same "parameter value A". Finally, the read completion percentage reached 100% in the third retried reproduction processing performed with the parameter set to the same "parameter value A" and ECC decoding was successfully completed for all of the data read out of the 100 RUBs.

In FIG. 6, the dotted line indicates the read completion percentages achieved in the five repetitions of retried reproduction processing performed with the parameter fixed to its initial value. In this case, the read completion percentage is approximately 42% after the fifth retried reproduction processing.

As described above, ECC decoding can be successfully completed for the data read out of RUBs by repeating retried reproduction processing with the parameter set to the same value.

Figure 7:
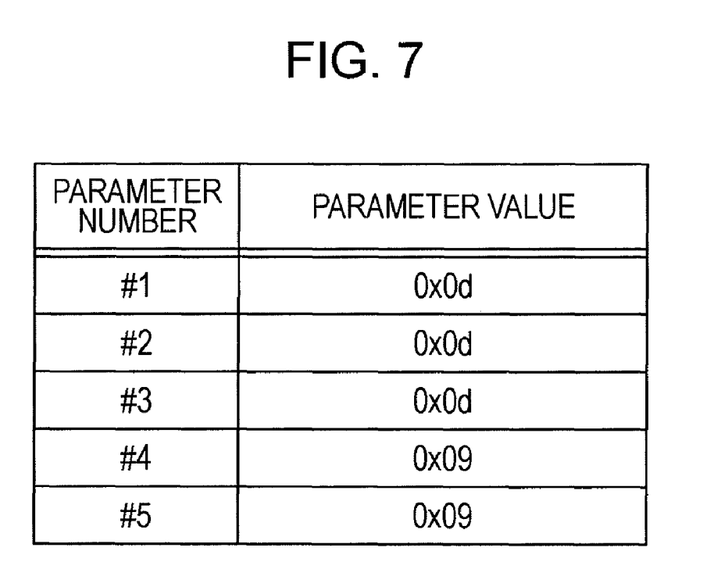
FIG. 7 is a schematic diagram showing an exemplary parameter table.

FIG. 7 shows exemplary parameter values set in the parameter table. For example, parameter value '0x0d' is associated with parameter numbers #1 through #3. Another parameter value '0x09' is associated with the parameter numbers #4 and #5. Prefix '0x' of each parameter value indicates that the value is in hexadecimal notation.

Parameter value '0x0d' is effective for scratches, bubbles, or other defects of 100 μm or more in size. This parameter value indicates the highest low-cutoff frequency setting in the high-pass filter 21, more specifically, a low-cutoff frequency approximately four times the one set by the initial parameter value. The AGC time constant is set to a value approximately two times the one set by the initial parameter value.

Parameter value '0x09' is effective for dust or other defects of 100 μm or less in size. This parameter value indicates the second highest low-cutoff frequency setting in the high-pass filter 21, more specifically, a low-cutoff frequency approximately two times the one set by the initial parameter value. The AGC time constant is set to a value approximately two times the one set by the initial parameter value.

Although five parameter values are listed in the parameter table in this example, the number of parameter values listed in the parameter table is not limited to this example, but can be determined according to the allowed number of retries.

[Reproduction Processing]

Figure 8:
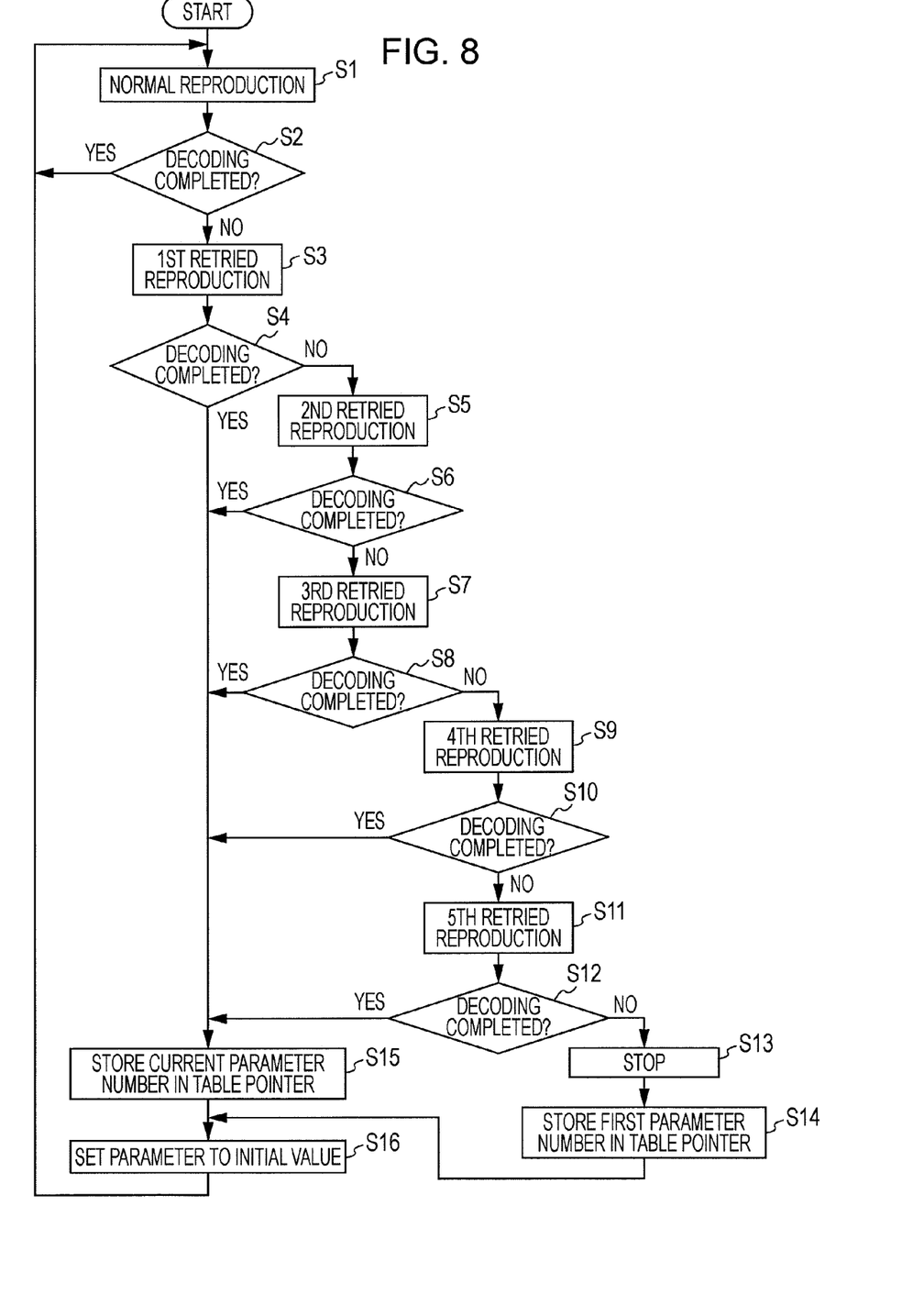
FIG. 8 is a flowchart illustrating the reproduction processing for reading data out of an optical disk for the first time.
Figure 9:
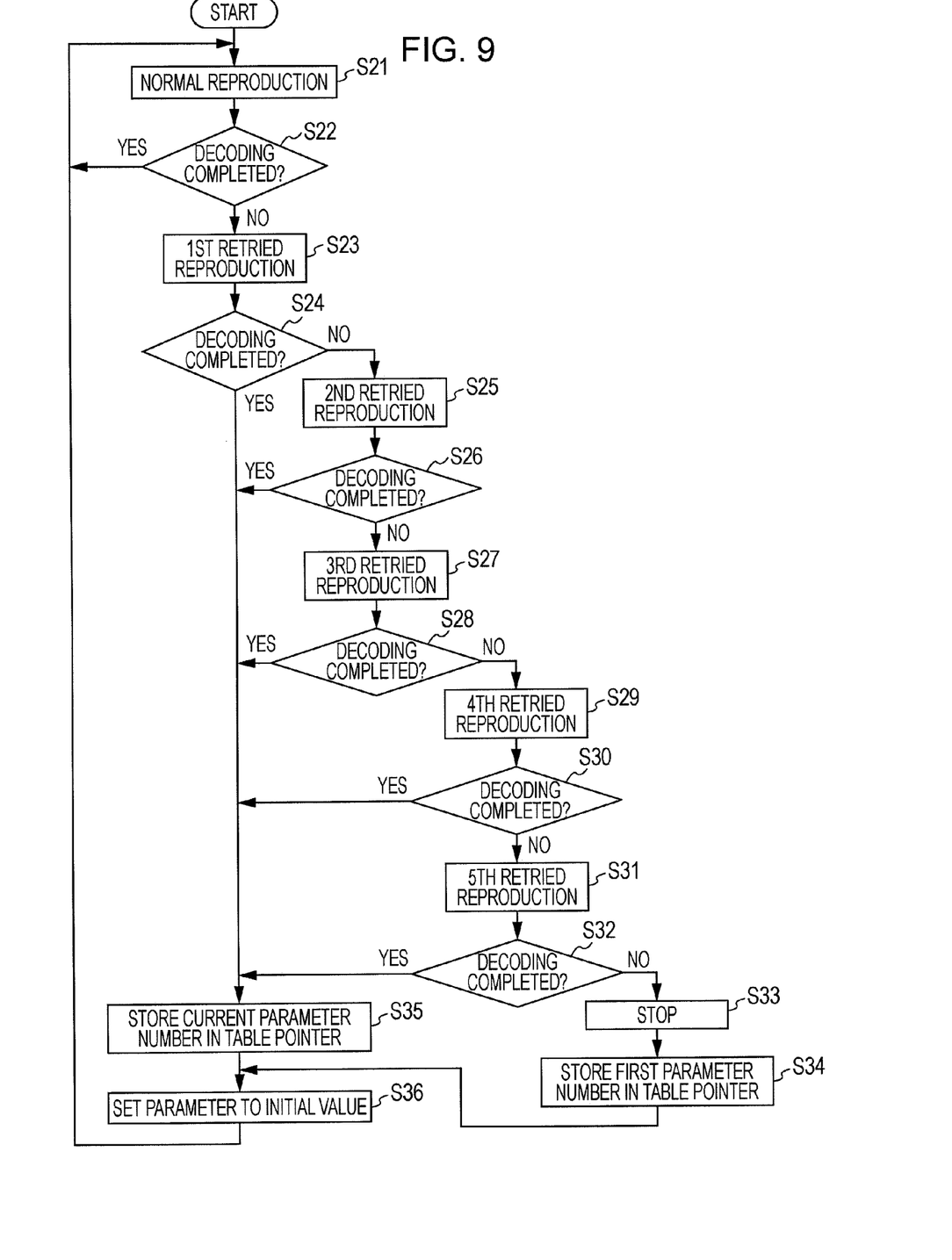
FIG. 9 is a flowchart illustrating the reproduction processing for reading data out of another RUB.

A flow of reproduction processing by the reproduction apparatus 1 applicable to the embodiment of the present invention will now be described with reference to the flowcharts shown in FIGS. 8 and 9. The processing described below is performed under control of the CPU 16, unless otherwise specified. In this example, five repetitions of retried reproduction processing are allowed. In the following, a series of processing from the first to fifth repetitions of retried reproduction processing will be described as a set of retried reproduction processing.

First, the reproduction processing for the data read out of a specific optical disk 10 for the first time will be described with reference to FIG. 8. In Step S1, the parameter is set to its initial value and ECC decoding is attempted in the normal reproduction processing for the data read out of a specific RUB. In Step S2, it is checked whether or not the ECC decoding was successfully completed in the normal reproduction processing. If it is determined that the ECC decoding was completed, processing returns to Step S1 where data is read out of the next RUB and the normal reproduction processing is performed for the read data. If it is determined that the ECC decoding was not successfully completed, processing proceeds to Step S3.

In Step S3, the parameter is set to the value associated with the parameter number #1 in the parameter table. ECC decoding is attempted in the first retried reproduction processing for the read data. In Step S4, it is checked whether or not ECC decoding was successfully completed in the first retried reproduction processing. If it is determined that ECC decoding was successfully completed, processing proceeds to Step S15. If it is determined that the ECC decoding was not successfully completed, processing proceeds to Step S5.

In Step S5, the parameter is set to the value associated with the parameter number #2 in the parameter table. ECC decoding is attempted in the second retried reproduction processing for the read data. In Step S6, it is checked whether or not the ECC decoding was successfully completed in the second retried reproduction processing. If it is determined that ECC decoding was successfully completed, processing proceeds to Step S15. If it is determined that the ECC decoding was not successfully completed, processing proceeds to Step S7.

In Step S7, the parameter is set to the value associated with the parameter number #3 in the parameter table. ECC decoding is attempted in the third retried reproduction processing for the read data. In Step S8, it is checked whether or not the ECC decoding was successfully completed in the third retried reproduction processing. If it is determined that ECC decoding was successfully completed, processing proceeds to Step S15. If it is determined that the ECC decoding was not successfully completed, processing proceeds to Step S9.

In Step S9, the parameter is set to the value associated with the parameter number #4 in the parameter table. ECC decoding is attempted in the fourth retried reproduction processing for the read data. In Step S10, it is checked whether or not the ECC decoding was successfully completed in the fourth retried reproduction processing. If it is determined that ECC decoding was successfully completed, processing proceeds to Step S15. If it is determined that the ECC decoding was not successfully completed, processing proceeds to Step S11.

In Step S11, the parameter is set to the value associated with the parameter number #5 in the parameter table. ECC decoding is attempted in the fifth retried reproduction processing for the read data. In Step S12, it is checked whether or not the ECC decoding was successfully completed in the fifth retried reproduction processing. If it is determined that ECC decoding was successfully completed, processing proceeds to Step S15. If it is determined that the ECC decoding was not successfully completed, processing proceeds to Step S13 and the reproduction processing stops. In Step S14, the first parameter number #1 in the parameter table is stored in a table pointer in the storage unit 20.

If ECC decoding was successfully completed in any of the first to fifth repetitions of the retried reproduction processing, the parameter number associated with the parameter value that was set in the retried reproduction processing is stored in the table pointer in Step S15. If ECC decoding was successfully completed in the first retried reproduction processing, for example, the parameter number #1 associated with the parameter value that was set in the first retried reproduction processing is stored in the table pointer. Similarly, if ECC decoding was successfully completed in any of the second to fifth repetitions of the retried reproduction processing, the corresponding one of the parameter numbers #2 to #5 is stored in the table pointer.

The parameter is set to its initial value in Step S16 and processing returns to Step S1 to repeat the above processing for the next RUB.

Next, the reproduction processing performed for the data read out of another RUB after ECC decoding was completed in the previous set of retried reproduction processing will be described with reference to FIG. 9. Described below is the case in which ECC decoding was completed in the third retried reproduction processing in the previous set of retried reproduction processing and parameter number #3 is stored in the table pointer.

In step S21, the parameter is set to its initial value and ECC decoding is attempted in the normal reproduction processing for the data read out of a specific RUB. In step S22, it is checked whether or not the ECC decoding was successfully completed in the normal reproduction processing. If it is determined that the ECC decoding was completed, processing returns to Step S21 where data is read out of the next RUB and the normal reproduction processing is performed for this data. If it is determined that the ECC decoding was not successfully completed, processing proceeds to Step S23.

In Step S23, the table pointer is referenced and the parameter is set to the value associated with the parameter number stored in the table pointer. ECC decoding is attempted in the first retried reproduction processing for the read data. More specifically, in this example, the parameter is set to the value associated with the parameter number #3 because parameter number #3 is stored in the table pointer. In Step S24, it is checked whether or not ECC decoding was successfully completed in the first retried reproduction processing. If it is determined that ECC decoding was successfully completed, processing proceeds to Step S35. If it is determined that the ECC decoding was not successfully completed, processing proceeds to Step S25.

In Step S25, the parameter is set to the value associated with the parameter number stored in the table pointer, i.e., the parameter number that was referenced in Step S23 plus one. ECC decoding is attempted in the second retried reproduction processing for the read data. In this example, the parameter is set to the value associated with the parameter number #4, i.e., the parameter number #3 referenced in Step S23 plus one.

In Step S26, it is checked whether or not the ECC decoding was successfully completed in the second retried reproduction processing. If it is determined that the ECC decoding was successfully completed, processing proceeds to Step S35. If it is determined that the ECC decoding was not successfully completed, processing proceeds to Step S27.

In Step S27, the parameter is set to the value associated with the parameter number stored in the table pointer, i.e., the parameter number referenced in Step S25 plus one. ECC decoding is attempted in the third retried reproduction processing for the read data. In this example, the parameter is set to the value associated with the parameter number #5, i.e., the parameter number #4 referenced in Step S25 plus one.

In Step S28, it is checked whether or not the ECC decoding was successfully completed in the third retried reproduction processing. If it is determined that the ECC decoding was successfully completed, processing proceeds to Step S35. If it is determined that the ECC decoding was not successfully completed, processing proceeds to Step S29.

In Step S29, the parameter is set to the value associated with the parameter number stored in the table pointer, i.e., the parameter number referenced in Step S27 plus one. ECC decoding is attempted in the fourth retried reproduction processing for the read data. In this example, the parameter should be set to the value associated with the parameter number #6, i.e., the parameter number #5 referenced in Step S27 plus one. In this example, however, the parameter number #5 is the highest number in the parameter table. In such a case, processing returns to the first parameter number and the parameter is set to the value associated with the first parameter number #1 in the parameter table.

In Step S30, it is checked whether or not ECC decoding was successfully completed in the fourth retried reproduction processing. If it is determined that the ECC decoding was successfully completed, processing proceeds to Step S35. If it is determined that the ECC decoding was not successfully completed, processing proceeds to Step S31.

In Step S31, the parameter is set to the value associated with the parameter number stored in the table pointer, i.e., the parameter number referenced in Step S29 plus one. ECC decoding is attempted in the fifth retried reproduction processing for the read data. In this example, the parameter is set to the value associated with the parameter number #2, i.e., the parameter number #1 referenced in Step S29 plus one.

In Step S32, it is checked whether or not the ECC decoding was successfully completed in the fifth retried reproduction processing. If it is determined that the ECC decoding was successfully completed, processing proceeds to Step S35. If it is determined that the ECC decoding was not successfully completed, processing proceeds to Step S33 and the reproduction processing stops. In Step S34, the first parameter number #1 in the parameter table is stored in the table pointer.

If ECC decoding was successfully completed in any of the first to fifth repetitions of the retried reproduction processing, the parameter number associated with the parameter value that was set for the retried reproduction processing is stored in the table pointer in Step S35. If ECC decoding was successfully completed in the first retried reproduction processing, for example, the parameter number #3 associated with the parameter value that was set in the first retried reproduction processing is stored in the table pointer. Similarly, if ECC decoding was successfully completed in any of the second to fifth repetitions of the retried reproduction processing, the corresponding one of the parameter numbers #4 to #2 is stored in the table pointer.

The parameter is set to its initial value in Step S36 and processing returns to Step S21 to repeat the above processing for the next RUB.

Although in the above description, the reproduction processing performed for the data read out of an RUB for the first time is different from the reproduction processing performed for the data read out of the next RUB after ECC decoding was completed in the previous set of retried reproduction processing, the embodiment of the present invention is not limited to this example. For example, parameter number #1 may be stored in the table pointer in advance and the parameter value to be set when data is read out of a RUB for the first time may be determined by referencing the table pointer.

Accordingly, it is possible to apply similar reproduction processing for the data read out of a RUB for the first time and for the data read out of another RUB after ECC decoding was completed in the previous set of retried reproduction processing.

As described above, in the embodiment of the present invention, the parameter number associated with the parameter value that was set in the previously retried reproduction processing in which ECC decoding was successfully completed is stored and used in the retried reproduction processing for the data read out of the next defective RUB. When data is read out of the next defective RUB, the parameter value associated with the stored parameter number is first applied for ECC decoding; if the ECC decoding fails, ECC decoding is attempted by sequentially changing the parameter values. Since the retried reproduction processing is performed by first applying the parameter value that is supposed to be most effective for the current defect, ECC decoding can be efficiently completed in a short time.

The reduction in the number of repetitions of the retried reproduction processing and thus the time for ECC decoding reduces accordingly the power consumption for ECC decoding.

2. Modification of Embodiment

A modification of the embodiment of the present invention will now be described. In the reproduction apparatus 1, startup processing usually takes place after the optical disk 10 is mounted. In the startup processing, the parameter is set to its initial value and the surface condition of the optical disk 10 is evaluated by measuring jitters and other phenomena of the reproduced RF signal of the data read out of the optical disk 10 mounted on the reproduction apparatus 1. Based on the evaluation results, various parameters are set and the normal reproduction processing is performed after the startup processing.

If retried reproduction processing takes place during the startup processing, the parameter setting may be changed and the surface condition of the optical disk 10 may not be measured accurately. This may affect the setting accuracies of the parameters that are set on the basis of the evaluation results.

In the modification of the embodiment of the present invention, the retried reproduction processing function can be turned off, if necessary, to prevent the change of parameter settings during the startup processing.

Figure 10:
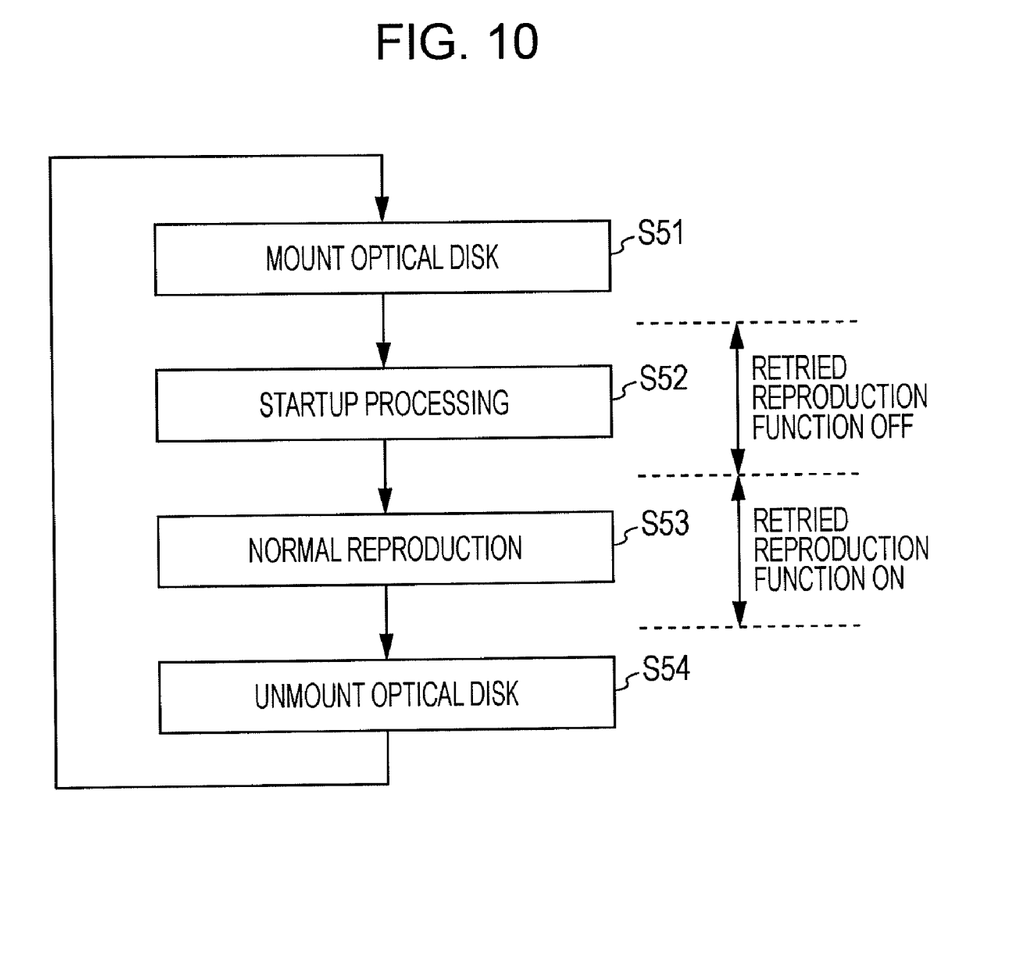
FIG. 10 is an exemplary operation flow of a reproduction apparatus applicable to a modification of the embodiment of the present invention.

FIG. 10 shows an exemplary operation flow of the reproduction apparatus 1. After the optical disk 10 is mounted in Step S51, the startup processing takes place in the reproduction apparatus 1 in Step S52. After the surface condition of the optical disk 10 is measured in the startup processing, normal reproduction processing takes place in Step S53. In Step S54, the optical disk 10 is removed.

During the startup processing, the parameter is set to its initial value and the retried reproduction processing function is turned off to prevent the change of parameter settings, so that the surface condition of the optical disk 10 can be measured accurately. Once the startup processing is completed, the retried reproduction processing function is turned on for the normal reproduction processing so that the parameters can be changed according to the disk surface condition and data is read.

[Reproduction Processing]

Figure 11:
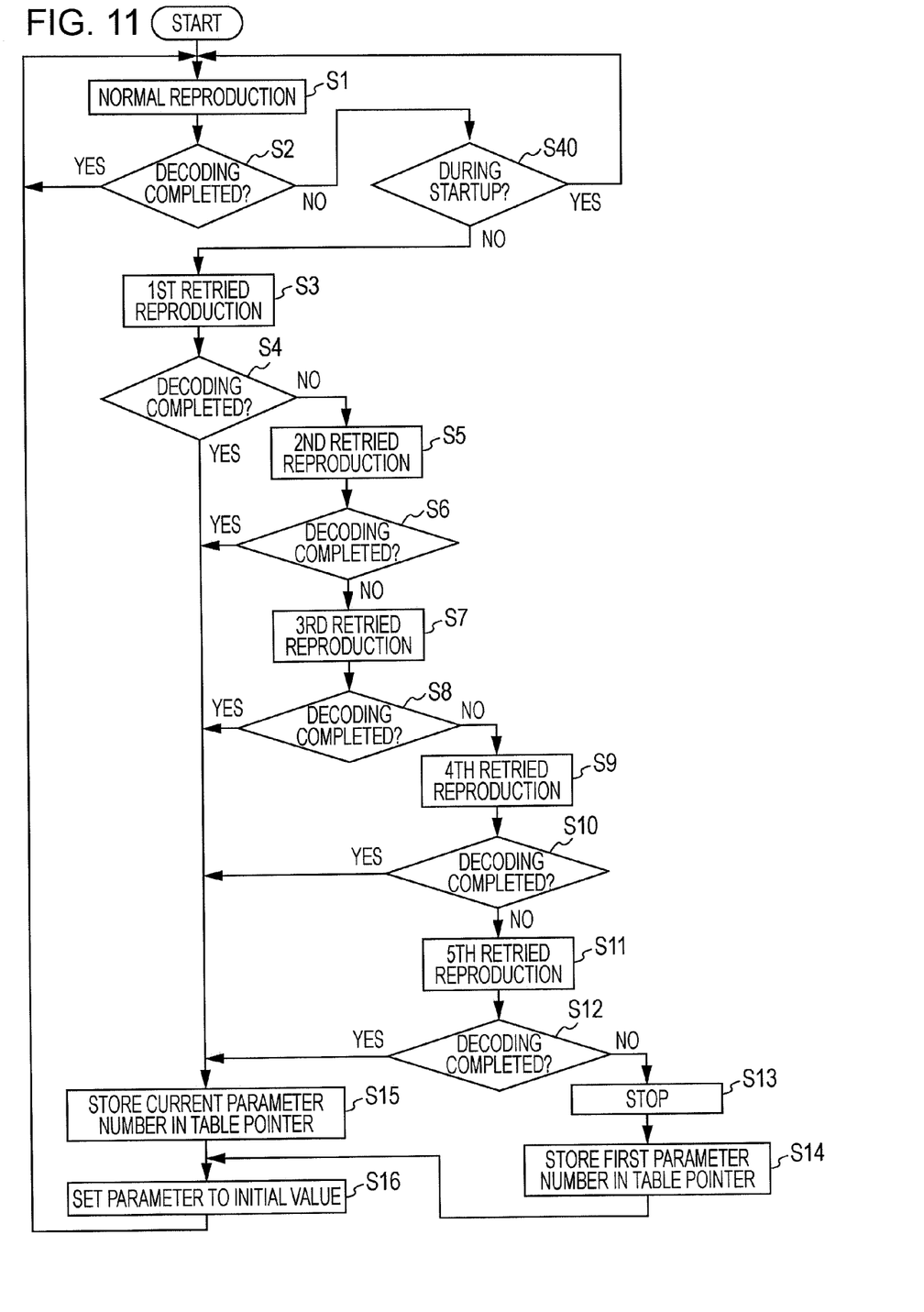
FIG. 11 is a flowchart illustrating reproduction processing applicable to the modification of the embodiment of the present invention.

A flow of reproduction processing by the reproduction apparatus 1 applicable to the modification of the embodiment of the present invention will now be described with reference to the flowchart shown in FIG. 11. The processing described below is performed under control of the CPU 16, unless otherwise specified. Like elements that perform processing similar to the above-described embodiment are designated by like reference numerals and detailed description thereof will be omitted.

In step S1, the parameter is set to its initial value and ECC decoding is attempted in the normal reproduction processing for the data read out of a specific RUB. In step S2, it is checked whether or not the ECC decoding was successfully completed in the normal reproduction processing. If it is determined that the ECC decoding was completed, processing returns to Step S1 where data is read out of the next RUB and the normal reproduction processing is performed for the read data. If it is determined that the ECC decoding was not successfully completed, processing proceeds to Step S40.

In Step S40, it is checked whether or not the startup processing is in progress. If the startup processing is in progress, processing returns to Step S1. If the startup processing is not in progress, processing proceeds to Step S3. The reproduction processing from Step S3 is the same as the one in the embodiment and description thereof will be omitted.

As described above, if the startup processing is in progress, processing returns to the normal reproduction processing to prevent the retried reproduction processing from taking place, so that the surface condition of the optical disk 10 can be measured accurately.

The present application contains subject matter related to that disclosed in Japanese Priority Patent Application JP 2008-296734 filed in the Japan Patent Office on Nov. 20, 2008, the entire content of which is hereby incorporated by reference.

Although the present invention has been described with reference to an embodiment and a modification thereof, the present invention is not limited to the above embodiment and modification, but may be modified and applied without deviating from the spirit and scope of the present invention. For example, although the retried reproduction processing function is turned off in the startup processing in the modification of the embodiment, the present invention is not limited thereto and the retried reproduction processing function may be turned off when it is desirable to fix the parameter to its initial value.

What is claimed is:

1. A reproduction apparatus comprising:
   a reproduction unit reading a reproduced signal of data recorded on an optical disk in units of recorded data;
   a reproduced signal processing unit performing ECC decoding for the reproduced signal using a predetermined parameter value set for the ECC decoding;
   a storage unit storing a parameter number associated with the currently set parameter value and a parameter table listing a plurality of parameter values and associated parameter numbers indicating an order of application of the parameter values; and
   a control unit controlling the reproduction unit and the reproduced signal processing unit;
   wherein the control unit, when the ECC decoding is not successfully completed, sequentially changes the parameter values in the order of the parameter numbers listed in the parameter table and controls the reproduced signal processing unit until the ECC decoding is successfully completed in retried reproduction processing and, when the ECC decoding is successfully completed, stores in the storage unit the parameter number associated with the currently set parameter value and sets in the next retried reproduction processing the parameter value associated with the stored parameter number in the reproduced signal processing unit.

2. The reproduction apparatus according to claim 1, wherein the reproduced signal processing unit includes:
   a high-pass filter suppressing a low-frequency component of the reproduced signal; and
   an AGC circuit automatically controlling the reproduced signal level to be constant;
   wherein the parameter value is used to set a low-cutoff frequency for the high-pass filter and a time constant for the AGC circuit.

3. The reproduction apparatus according to claim 1, wherein a plurality of identical parameter values are sequentially listed in the parameter table.

4. The reproduction apparatus according to claim 1, wherein the control unit controls the reproduced signal processing unit to prevent the retried reproduction processing from taking place in startup processing in which a surface condition of the optical disk is measured, even if the ECC decoding is not successfully completed in the normal reproduction processing.

5. A reproduction method comprising the steps of:
   performing reproduction by reading a reproduced signal of data recorded on an optical disk in units of recorded data;

processing the reproduced signal by performing ECC decoding using a predetermined parameter value set for the ECC decoding for the reproduced signal read out of the optical disk;

storing in a storage unit a parameter number associated with the currently set parameter value and a parameter table listing a plurality of parameter values and associated parameter numbers indicating an order of application of the parameter values; and controlling the step of performing reproduction and the step of processing the reproduced signal;

wherein the step of controlling, when the ECC decoding is not successfully completed, changes parameter setting in the order of the parameter numbers listed in the parameter table and controls the step of processing the reproduced signal until the ECC decoding is successfully completed in retried reproduction processing and, when the ECC decoding is successfully completed, stores in the storage unit the parameter number associated with the currently set parameter value, and sets in the next retried reproduction processing a parameter value associated with the stored parameter number.

* * * * *